United States Patent
Menegoli et al.

(10) Patent No.: US 8,441,770 B2
(45) Date of Patent: May 14, 2013

(54) VOLTAGE SPIKES CONTROL FOR POWER CONVERTERS

(75) Inventors: Paolo Menegoli, San Jose, CA (US); Fabio Alessio Marino, San Jose, CA (US)

(73) Assignee: ETA Semiconductor Inc, San Jose, CA (US)

( * ) Notice: Subject to any disclaimer, the term of this patent is extended or adjusted under 35 U.S.C. 154(b) by 222 days.

(21) Appl. No.: 12/932,071

(22) Filed: Feb. 18, 2011

(65) Prior Publication Data

US 2012/0212861 A1 Aug. 23, 2012

(51) Int. Cl.
*H02H 3/20* (2006.01)
*H01H 47/00* (2006.01)

(52) U.S. Cl.
USPC ............ 361/144; 361/18; 361/91.1; 361/91.5

(58) Field of Classification Search ............... 361/18, 361/91.1, 91.5, 144
See application file for complete search history.

(56) References Cited

U.S. PATENT DOCUMENTS

| | | | |
|---|---|---|---|
| 4,958,121 A | | 9/1990 | Cuomo et al. |
| 5,946,178 A | * | 8/1999 | Bijlenga ..................... 361/91.5 |
| 6,373,731 B1 | * | 4/2002 | Iwamura et al. .......... 363/56.05 |
| 6,490,182 B2 | * | 12/2002 | Katoh et al. ............... 363/56.05 |
| 7,187,226 B2 | | 3/2007 | Audi |

* cited by examiner

Primary Examiner — Rexford N Barnie
Assistant Examiner — Zeev V Kitov

(57) ABSTRACT

A novel inductive overvoltage suppression circuit for power converters is presented. High amplitude voltage spikes are generally occurring in high frequency power converters in presence of small parasitic inductances coupled to the power distribution rails, in correspondence of the switching transitions, particularly when high load currents are required. The presented invention proposes active clamps to limit the amplitude of the overvoltage. Furthermore the excess energy in the parasitic inductances is utilized to provide energy and/or a signal to determine when to turn on the next phase power device with the fastest transition possible without incurring in cross-conduction currents in the power stage of the converter, thus improving its overall performance, and circuit reliability in addition to achieving high conversion efficiency.

16 Claims, 7 Drawing Sheets

VOLTAGE SPIKES CONTROL FOR POWER CONVERTERS

BACKGROUND OF THE INVENTION

1. Field of the Invention

The present invention is in the field of integrated switching power circuits. The present invention is further in the field of switching power converters. The present invention further relates to the field of high frequency drivers of inductive loads. The implementation is not limited to a specific technology, and applies to either the invention as an individual component or to inclusion of the present invention within larger systems which may be combined into larger integrated circuits.

2. Brief Description of Related Art

Modern electronic applications require power management devices that supply power to integrated circuits or more generally to complex loads. In general, power switching converters are becoming more and more important for their compact size, cost and efficiency. In particular the size of the power converters is related to the values of the passive components utilized and that, in its turn, is directly linked to the operating switching frequency.

In order to operate switching power converters at high frequencies with acceptable efficiency, the switching transitions of the power devices have to be very fast. Fast switching, when combined with high load currents, poses several challenges. In particular the interconnections of the power devices to the positive and negative terminals of the input power source are generally associated with parasitic resistances and inductances.

As mentioned, the high frequency switching of the power converters is meant to reduce the size of the main output inductor and filter capacitors. However when the value of the main inductor approaches the value of the parasitic inductances present in the circuit, the transfer of energy that occurs at every transition becomes very critical affecting negatively the efficiency and reliability of the circuit.

In particular if the operation of a buck power converter is analyzed, one can note that when the high side power device is on, if a parasitic inductance is present between the switch and the positive terminal of the power source, a small but not insignificant amount of energy gets stored in the parasitic inductance. This energy is proportional to the square of the main inductor current that is flowing in the high side power device. The amplitude of this current is typically very close to the load current.

When the high side power device turns off, the energy stored in the parasitic inductance generates a fast and temporary overvoltage at the node of the high side power device terminal. The amplitude of this overvoltage is determined by the equation:

$$V = L\, di/dt$$

From the above equation it is evident that the value of the parasitic inductance, the rate of change of the current (speed of the switching and capacitance associated with the node), and the load current have a direct impact on the overvoltage occurring across the high side switch at its turn off.

The load current establishes the energy stored in the inductor before the turn off of the power device according to the equation:

$$E = \tfrac{1}{2} L i^2$$

The higher the energy that has to be released, the higher the amplitude of the potential voltage spike at the power source interconnection.

This overvoltage can pose serious reliability problems and potentially catastrophic damage to the integrated circuit. Higher voltage devices could be used to make the circuit more robust to withstand the voltage spikes but generally that is not the preferred solution because of increased manufacturing costs and lower high frequency performances. It is therefore very important to limit or clamp as much as possible this overvoltage events.

The most common solution is to use a capacitor as shown in FIG. 1. The capacitor C2 is placed between the nodes 1 and 2. The lumped parasitic inductors L2 and L3 include the inductance of the metal interconnections in the integrated circuit, of the connections of the integrated circuit to the external world (bonding wire, bumps or metallic pillars), and of the circuit board traces. The combined inductances can typically be in the order of a few nH. The nodes 1 and 2 characterize for simplicity the nodes of the integrated circuit power pads therefore C2 is placed between the positive and the negative integrated circuit power terminals when integrated.

The capacitor C2 is charged when the transistor M1 is turned off and provides current to the load and to the reverse recovery charge of the low side transistor M2 intrinsic body diode when M1 is turned back on. Therefore the capacitor C2 is charged with the excess energy present in L2 in one switching phase and is discharged in the opposite switching phase. The value of the capacitor C2 is dependent on the power converter load current and it should be sized for the maximum load current and the maximum overvoltage that the transistor M1 can withstand without any failure.

If the current load is in the order of a few amperes, the parasitic inductance is a few nH and the switching occurs very fast, the value of the capacitor C2 can be too high to be cost effectively integrated in the chip. These considerations force the use of external capacitors placed very closely to the power distribution rail pads in order to minimize the associated parasitic inductances. Thus the manufacturing costs can become excessive to justify the utilization of high frequency power converters.

Other methods to limit the parasitic inductive overvoltage include the utilization of clamps like the one described in Cuomo et al. (U.S. Pat. No. 4,958,121) where a zener diode limits the voltage, at the drain and source terminals of a switching power device, at a desired voltage, but when the main switching inductance is of the same order of magnitude of the parasitic one, this method introduces very negative effects.

Another major limitation to the integration of very high frequency power converters is the control of the shoot-through current in the power stage. The shoot-through current is also called cross-conduction current and it refers to the phenomenon that occurs when both power devices are conducting simultaneously for a very short time of the period. In such event the possible current in the power transistors is not controlled, it can be very high, it can damage or degrade the power devices and it represents extra power dissipated in the chip, adversely affecting the overall efficiency of the power converter.

The most common solution to prevent cross-conduction current is to utilize anti cross-conduction circuits in the driver circuit as shown in FIG. 2. The depicted circuit guarantees that, when a switching transition is requested, the first occurrence is the turning off of the transistor that was on. Only after the voltage change of the gate of the device turning off is sensed, the turning on of the other power device is allowed and commanded. This circuit is very effective in assuring that the Vgs of the power devices are not above threshold simultaneously, but it introduces a propagation delay in the driver due to the number of logic gates that the driving signal has to travel through.

This driver propagation delay may not be acceptable in very high frequency power converters because the duty cycle in extreme conditions of Vout and Vin may impose to the control loop to react within very few ns. Many other schemes are used in the industry, like the one described in Audi (U.S. Pat. No. 7,187,226). One of the most common means is the optimization of break before make timing. But all these schemes are either not safe enough to preventing cross-conduction current in the power devices or they introduce transition losses that affect the overall power converter efficiency.

It is therefore a purpose of the present invention to describe a novel structure of overvoltage suppression circuit that guarantees fast power switching transitions without causing cross-conduction current in the power output stage of switching power converters, while maintaining low manufacturing costs and high conversion efficiency.

SUMMARY OF THE INVENTION

It is an objective of the present invention to provide a circuit that eliminates or reduces significantly the overvoltage spikes caused by the turning off of a power device in presence of parasitic inductances in the power source interconnections for a switching power converter that operates at high switching frequency.

It is another objective of the present invention to provide a method for driving the power devices of a high frequency power converter preventing cross-conduction current and with minimum propagation delay.

The present invention describes an active clamp of the overvoltage spikes caused by the turning off of a power devices when parasitic interconnection inductances are present, while making use of the excess energy stored in the parasitic inductance, or a portion of it, to drive the gate of the transistor that is expected to turn on in the successive phase or while making use of the signal generated by the inductive "kick" to determine that the power device is in fact turning off.

It is important to note that the circuit described in the present invention can be used in conjunction with the conventional methods described above, like the addition of a filter capacitor, being perfectly compatible and not necessarily in alternative to them. When used in conjunction the size of the filter capacitor can be substantially reduced.

The present invention, in its preferred embodiment, shown in FIG. 3, describes a transistor M3 with its source connected to the node 1, where the overvoltage spike generally occurs, its gate tied to the "low current" version of the input power source terminal through a parasitic inductor L4 and its drain connected to the gate of the low side drive M2. The "low current" version of the input power source terminal is purposely distinct from its "high current" or "power" version, where the load current is flowing.

Therefore the present invention assumes the separation of the power path from the lower current path in the power distribution rails for the input power source. It is evident to anyone skilled in the art that many portions of the circuit may be connected to the lower current input power pad, even though they have not been represented in FIG. 3 for clarity. The parasitic inductance L4 is most likely of the same order of magnitude of the inductor L2 (maybe a bit larger), but the lack of large current flowing in it makes the voltage at the node 5 much more stable that the voltage at the node 1.

When the transistor M1 is turned off, as soon as the current in L1 starts getting diverted, the voltage of the node 1 jumps up, but when it reaches the threshold of the transistor M3, the current of L2 starts flowing in M3 to charge the gate of the transistor M2. This assumes that the transistor in the pre-driver circuit 4, that kept M2 in off state, is turned off when the transition is desired. This mechanism has the effect of lowering the energy that would be required to charge the gate of M2 while clamping the voltage at the node 1. In addition this makes the transition safe and very fast.

It should be noticed that the energy present in L2, when in operation, depends on the load, therefore in light load conditions, for example when the power converter is operating in DCM (Discontinuous Current Mode), the energy stored in L2 may not be sufficient to drive the gate of the transistor M2 to full enhancement. That is why the gates of the power devices are still connected to the pre-driver circuit 4, effectively creating two parallel paths to drive the gates of the power devices.

The drive signal coming from the pre-driver circuit 4 is purposely slower because when the load current is small a tiny propagation delay in the switching transitions is more acceptable, in fact, typically, the DCM occurs at lower switching frequencies (Pulse Frequency Modulation). In practical terms the signal coming from the circuit 4 provides a back up for fully turning on the power devices and for keeping them off when needed.

On the other hand, when the load current is very high the energy stored in L2 can be so large that the gate of M2 could be overcharged. In that case either a clamp should be added to the M2 gate node (like a zener diode) or a capacitor should still be added between the nodes 1 and 2. However the capacitor required is certainly smaller than the prior art case described above. The zener has the benefit that becomes active only when and if required, on the other hand the filter capacitor does recover the energy better than the zener diode clamp.

It should also be noticed that with the circuit proposed in the present invention, the current in the parasitic inductor L2 decays less rapidly than the case where no clamp is present, but more rapidly than the case where a filter capacitor is used. This is explained with the equation reported above, since higher recirculation voltages make the recirculation faster. Moreover with the circuit of FIG. 3 the resonance ringing at the node 1 is less pronounced in amplitude and it also decays much more rapidly because the effective impedance seen at the node with the proposed clamp is quite different (less parasitic capacitance).

The transistor M4 similarly turns on when the device M2 is getting turned off. In continuous current mode (high load current) the current in the main inductor L1 is always positive and the node 2 experiences an overvoltage. This overvoltage spike drives the gate voltage of the transistor M4 above its threshold voltage thus causing current to be drawn from the gate of the power transistor M1, effectively charging its gate voltage to turn M1 on. In this case the overvoltage at the node 2 provides a signal indicating that the power device M2 is turning off and it is therefore safe to turn M1 on.

However, in this case, the energy stored in L3 is not utilized to charge the gate of M1, but similarly it could be utilized by using a PMOS transistor to drive a signal internal to the driver circuit and not shown in FIG. 3, as is clear to anyone skilled in the art. It should be noted that the transistors M3 and M4 should have an adequate size to reach high transconductance and allow large spikes of current to flow with minimum dissipation.

In the case the load current is very high, two or more similar clamps may be necessary to make sure that the overvoltage at the node 1 does not reach unsafe values. FIG. 4 shows an example of an embodiment in which an extra transistor M5 is added to divert some of the energy present in L2 directly to the load when the power device M1 is turning off. As is well known to anyone skilled in the art, the thresholds and relative sizes of the transistor M3 and M4 may be different in order to give priority to one path or the other, dependent on the circumstances. For instance the body connections of the transistors M3 and M5 could be connected to different nodes to allow M5 to turn on at higher voltage than M3.

In the case described in FIG. 4 the excess energy in L2 is diverted to the load increasing the overall efficiency of the converter. If the transistor M5 turns on when the load currents are high, and if the size of the filter capacitor C1 is adequate no excess ripple is exhibited at the output voltage.

Similarly to the case of the buck converter described above, negative voltage glitches may negatively affect the devices of high frequency inductive boost converters as shown in FIG. 5. In FIG. 5 the main boost inductor is L6 while the inductors L7 and L8 represent the parasitic inductances of the main high current interconnections. The main power device is the transistor M6. When M6 turns off a negative glitch occurs at the node 11 in correspondence of the rising in voltage of the drain of M6 approximately to the boost output voltage. This negative voltage glitch at node 11 increases the voltage that M6 has to be capable of withstanding between its drain and source, potentially introducing reliability and catastrophic problems for the integrated circuit.

A capacitor in parallel to L7 can reduce this negative voltage spike but it is costly and it introduces a resonant circuit. In alternative the present invention proposes the addition of the transistor M8 of FIG. 5. The transistor M8 turns on when the voltage at node 11 is negative enough to cause the VGS of M8 to be higher than its threshold. The excess energy in L7 causes current to flow in M8 and, in its turn, it charges the gate of the transistor M7. Therefore, in analogous way to the case of the buck converter described above, the energy in the parasitic inductor L7 is utilized to obtain a very fast transition guaranteeing that M6 and M7 are not in on condition simultaneously even for a very short time.

Also when the transistor M7 turns off a negative voltage glitch occurs at the node 12. Again the excess energy stored in L8 can be utilized to indicate that M7 is turning off and it is therefore safe to turn on M6. The circuit to implement such function is not shown in FIG. 5 and it can be implemented in various ways as it is known to anyone skilled in the art.

As is clear to those skilled in the art, this basic system can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 3

Figure 3:
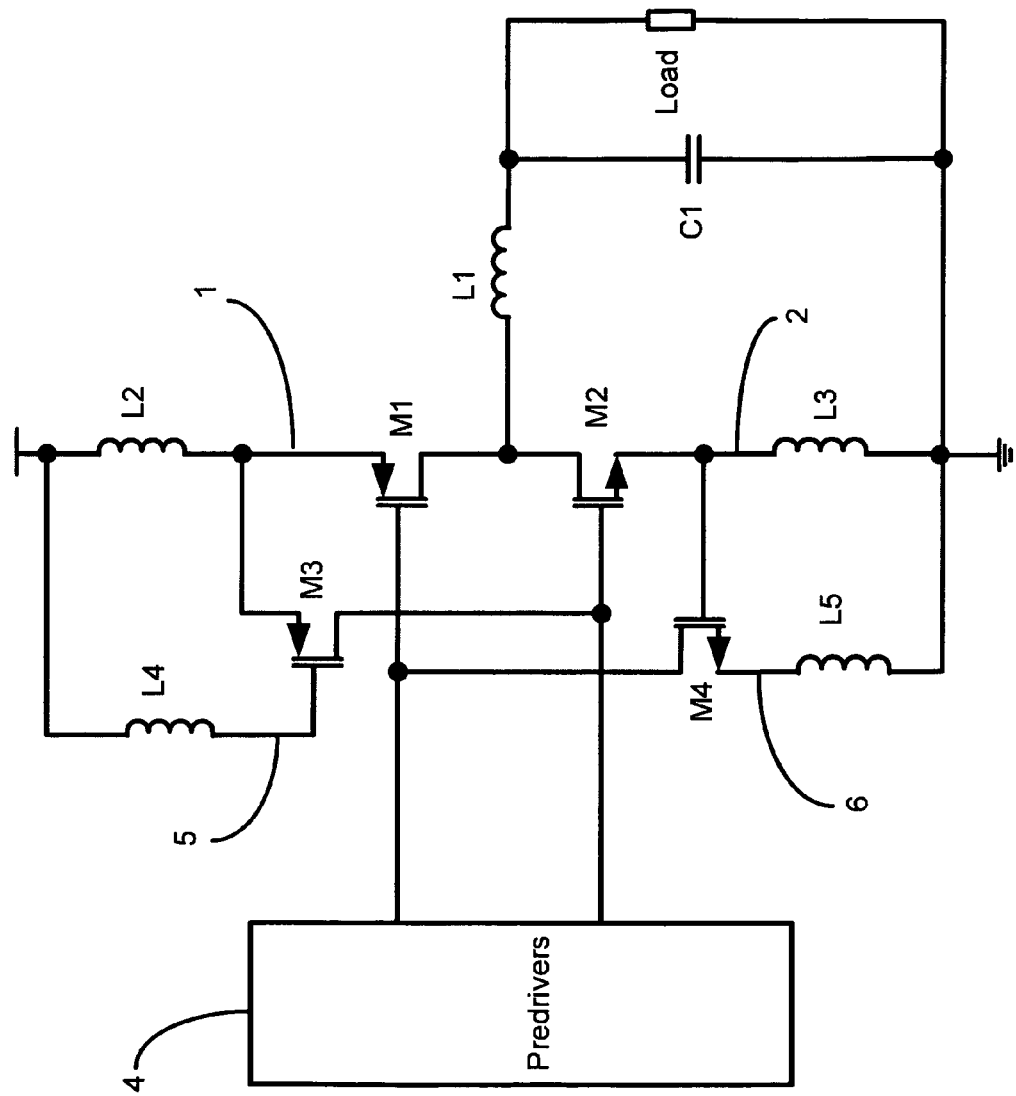
FIG. 3 shows a schematic of the output stage of a buck power converter with voltage spike reduction and cross-conduction protection circuit according to the preferred embodiment of the present invention.

FIG. 3 is showing a schematic of the output stage of a buck power converter with voltage spike reduction and cross conduction protection circuit according to the preferred embodiment of the present invention. FIG. 3, describes a transistor M3 with its source connected to the node 1, where the overvoltage spike generally occurs, its gate tied to the "low current" version of the input power source terminal through a parasitic inductor L4 and its drain connected to the gate of the low side drive M2. The "low current" version of the input power source terminal is purposely distinct from its "high current" or "power" version, where the load current is flowing.

Therefore the present invention assumes the separation of the power path from the lower current path in the power distribution rails for the input power source. It is evident to anyone skilled in the art that many portions of the circuit may be connected to the lower current input power pad, even though they have not been represented in FIG. 3 for clarity. The parasitic inductance L4 is most likely of the same order of magnitude of the inductor L2 (maybe a bit larger), but the lack of large current flowing in it makes the voltage at the node 5 much more stable that the voltage at the node 1.

When the transistor M1 is turned off, as soon as the current in L1 starts getting diverted, the voltage of the node 1 jumps up, but when it reaches the threshold of the transistor M3, the current of L2 starts flowing in M3 to charge the gate of the transistor M2. This assumes that the transistor in the pre-driver circuit 4, that kept M2 in off state, is turned off when the transition is desired. This mechanism has the effect of lowering the energy that would be required to charge the gate of M2 while clamping the voltage at the node 1. In addition this makes the transition safe and very fast.

It should be noticed that the energy present in L2, when operating, depends on the load, therefore in light load conditions, for example when the power converter is operating in DCM (Discontinuous Current Mode), the energy stored in L2 may not be sufficient to drive the gate of the transistor M2 to full enhancement. That is why the gates of the power devices are still connected to the pre-driver circuit 4, effectively creating two parallel paths to drive the gates of the power devices.

The drive signal coming from the pre-driver circuit 4 is purposely slower because, when the load current is small, a tiny propagation delay in the switching transitions is more acceptable, in fact typically the DCM occurs at lower switching frequencies (Pulse Frequency Modulation). In practical terms the signal coming from the circuit 4 provides a back up for fully turning on the power devices and for keeping them off when needed.

On the other hand, when the load current is very high the energy stored in L2 can be so large that the gate of M2 could be overcharged. In that case either a clamp should be added to the M2 gate node (like a zener diode) or a capacitor should still be added between the nodes 1 and 2. However the capacitor required is certainly smaller than the prior art case described above. The zener has the benefit that becomes active only when and if required, on the other hand the filter capacitor does recover the energy better than the zener diode clamp.

It should also be noticed that with the circuit proposed in the present invention, the current in the parasitic inductor L2 decays less rapidly than the case where no clamp is present, but more rapidly than the case where a filter capacitor is used. This is explained with the equation reported above, since higher recirculation voltages make the recirculation faster. Moreover, with the circuit of FIG. 3, the resonance ringing at the node 1 is less pronounced in amplitude and it also decays much more rapidly because the effective impedance seen at the node with the proposed clamp is quite different.

The transistor M4 similarly turns on when the device M2 is being turned off. In continuous current mode (high load current) the current in the main inductor L1 is always positive and the node 2 experiences an overvoltage. This overvoltage spike drives the gate voltage of the transistor M4 above its threshold voltage thus causing current to be drawn from the gate of the power transistor M1, effectively charging its gate voltage to turn M1 on. In this case the overvoltage at the node 2 provides a signal indicating that the power device M2 is turning off and it is therefore safe to turn M1 on.

However, in this case, the energy stored in L3 is not utilized to charge the gate of M1, but similarly it could be utilized by using a PMOS transistor to drive a signal internal to the driver circuit and not shown in FIG. 3, as is clear to anyone skilled in the art. It should be noted that the transistors M3 and M4 should have an adequate size to reach high transconductance and allow large spikes of current to flow with minimum dissipation.

B FIG. 4

Figure 4:
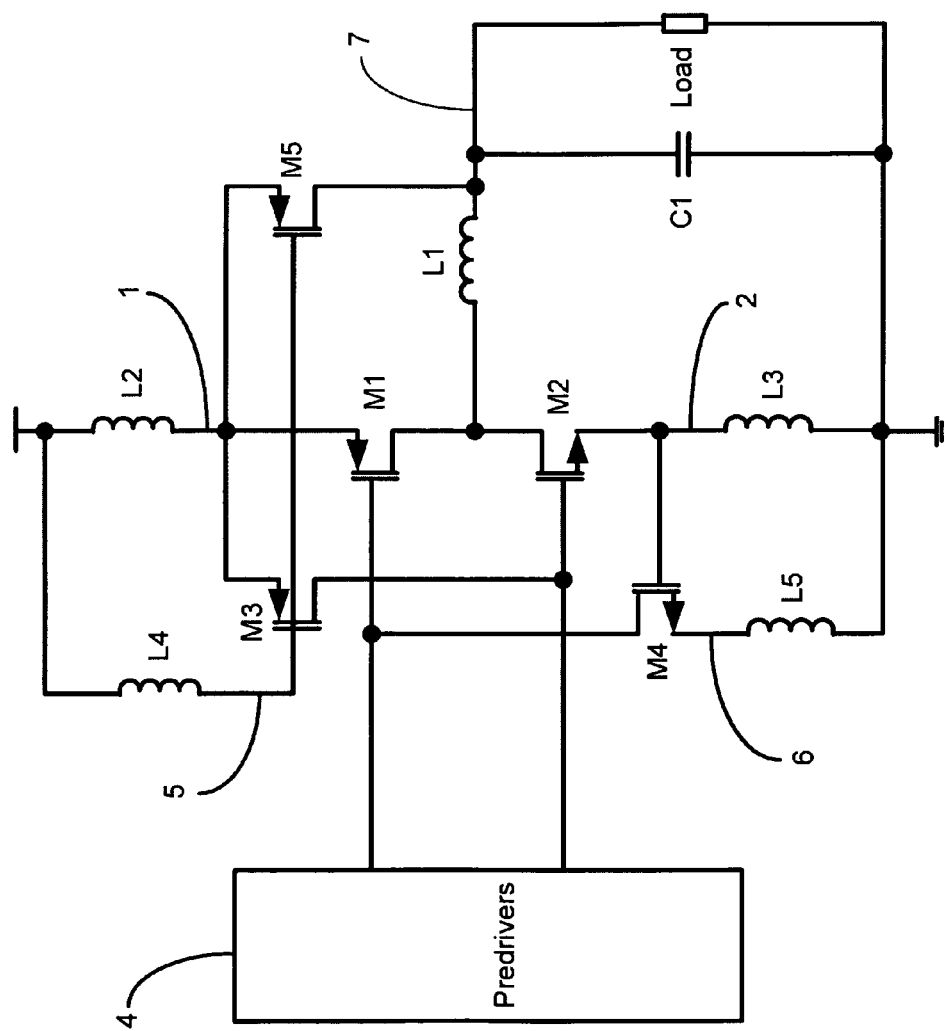
FIG. 4 shows a schematic of the output stage of a buck power converter with voltage spike reduction and cross-conduction protection circuit according to another embodiment of the present invention.

In the case the load current is very high, two or more similar clamps may be necessary to make sure that the overvoltage at the node 1 does not reach unsafe values. FIG. 4 shows an example of an embodiment in which an extra transistor M5 is added to divert some of the energy present in L2 directly to the load when the power device M1 is turning off. As is well known to anyone skilled in the art, the thresholds and relative sizes of the transistor M3 and M4 may be different in order to give priority to one path or the other, dependent on the circumstances. For instance the body connections of the transistors M3 and M5 could be connected to different nodes to allow M5 to turn on at higher voltage than M3.

In the case described in FIG. 4 the excess energy in L2 is diverted to the load increasing the overall efficiency of the converter. If the transistor M5 turns on when the load currents are high, and if the size of the filter capacitor C1 is adequate no excess ripple is exhibited at the output voltage.

C FIG. 5

Figure 5:
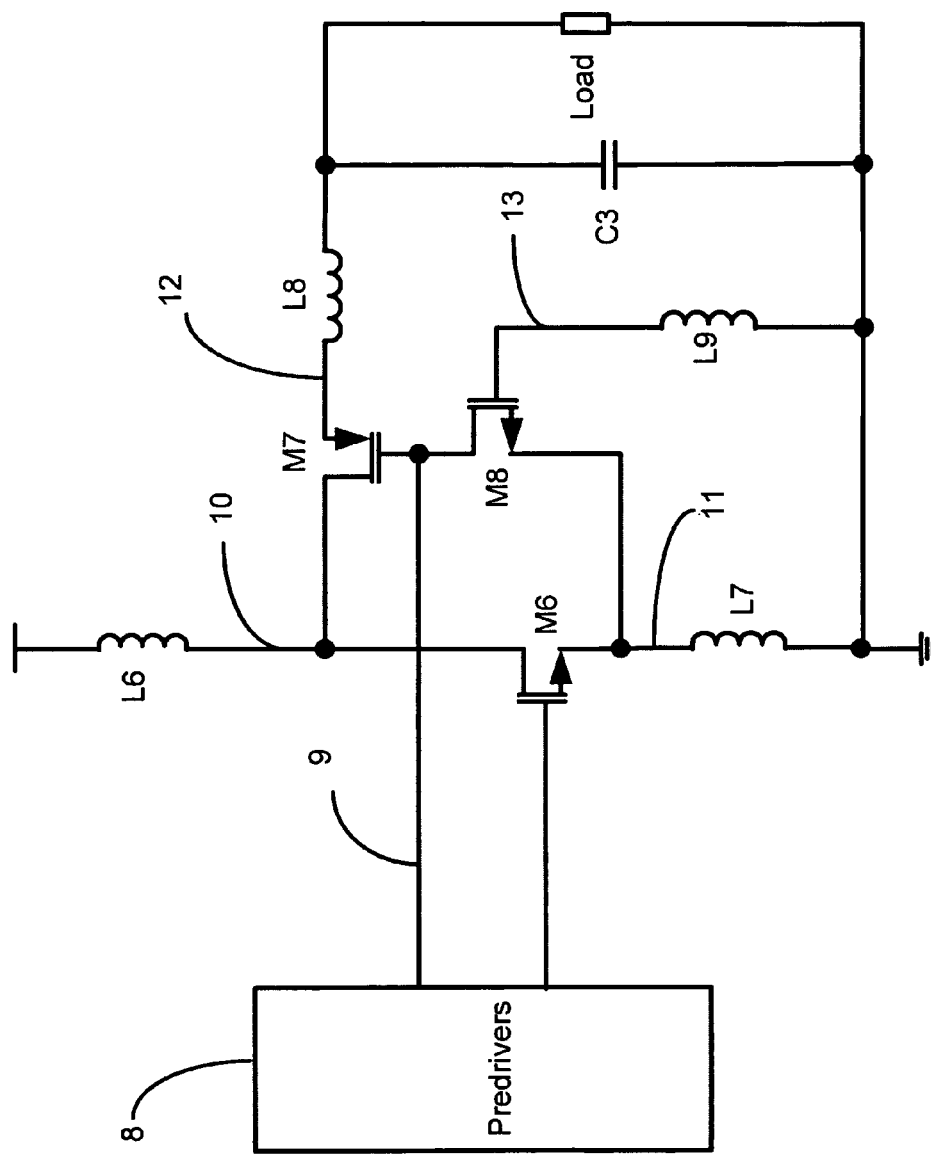
FIG. 5 shows a schematic of the output stage of a boost power converter with voltage glitch reduction and cross-conduction protection circuit according to a further embodiment of the present invention.

Similarly to the case of the buck converter described above, negative voltage glitches may negatively affect the devices of high frequency inductive boost converters as shown in FIG. 5. In FIG. 5 the main boost inductor is L6 while the inductors L7 and L8 represent the parasitic inductances of the main high current interconnections. The main power device is the transistor M6. When M6 turns off a negative glitch occurs at the node 11 in correspondence of the rising in voltage of the drain of M6 approximately to the boost output voltage. This negative voltage glitch at node 11 increases the voltage that M6 has to be capable of withstanding, between its drain and source, potentially introducing reliability and catastrophic problems for the integrated circuit.

A capacitor in parallel to L7 can reduce this negative voltage spike but it is costly and it introduces a resonant circuit. In alternative the present invention proposes the addition of the transistor M8 of FIG. 5. The transistor M8 turns on when the voltage at node 11 is negative enough to cause the VGS of M8 to be higher than its threshold. The excess energy in L7 causes current to flow in M8 and, in its turn, it charges the gate of the transistor M7. Therefore, in analogous way to the case of the buck converter described above, the energy in the parasitic inductor L7 is utilized to obtain a very fast transition guaranteeing that M6 and M7 are not in on condition simultaneously even for a very short time.

Also when the transistor M7 turns off a negative voltage glitch occurs at the node 12. Again the excess energy stored in L8 can be utilized to indicate that M7 is turning off and it is therefore safe to turn M6 on. The circuit to implement such function is not shown in FIG. 5 and it can be implemented in various ways as it is well known to anyone skilled in the art.

D FIG. 6

Figure 1:
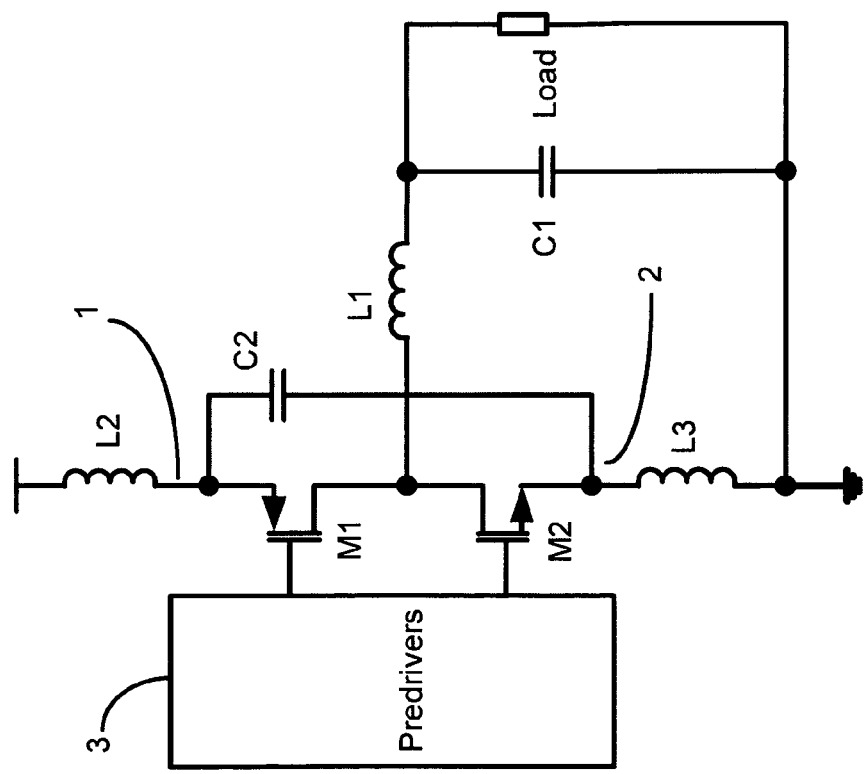
FIG. 1 shows a general inductive buck switching power converter output stage topology with filter capacitor (prior art).
Figure 2:
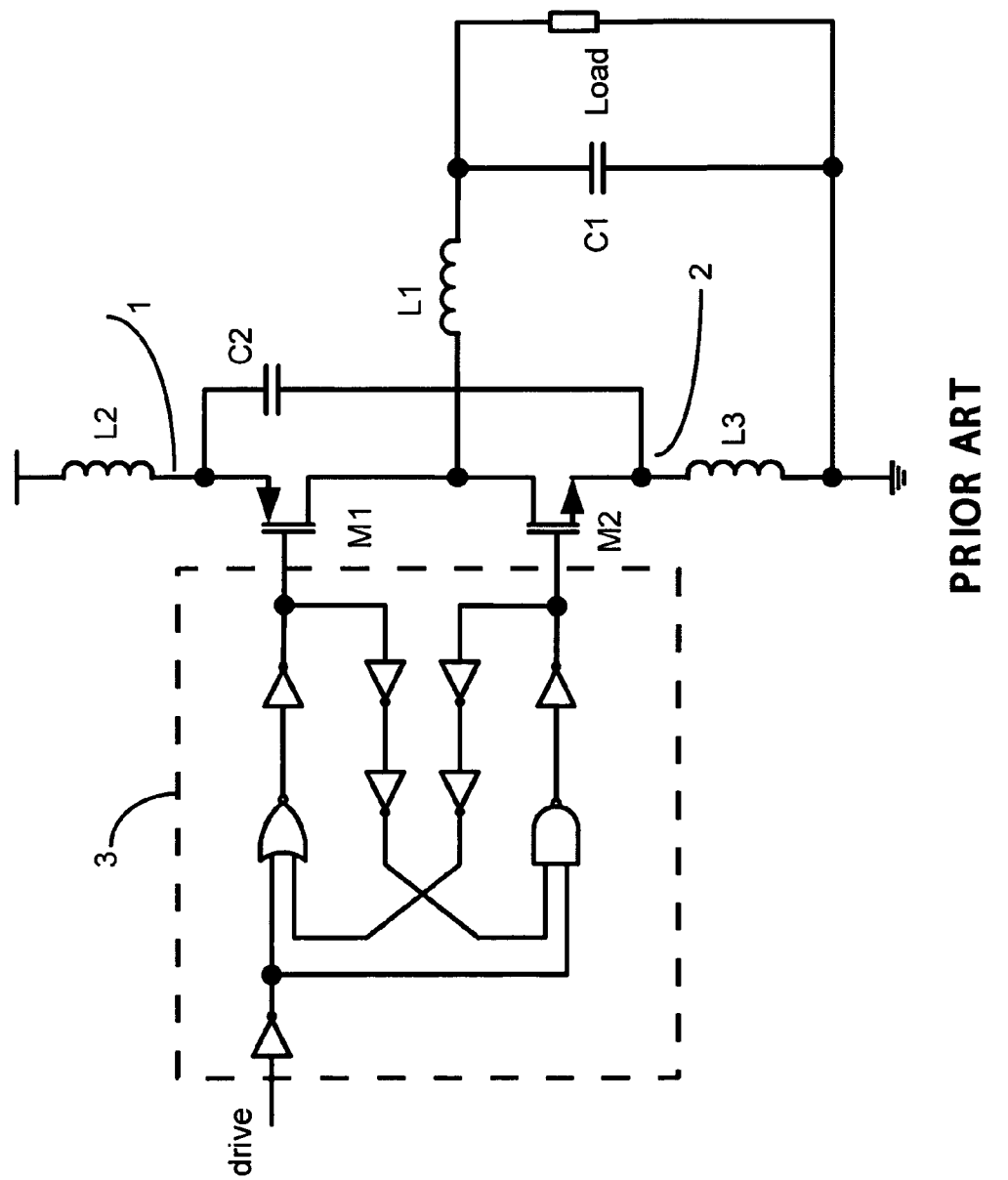
FIG. 2 shows a schematic of the pre-driver circuit topology of a buck switching power converter with cross-conduction protection feature (prior art).
Figure 6:
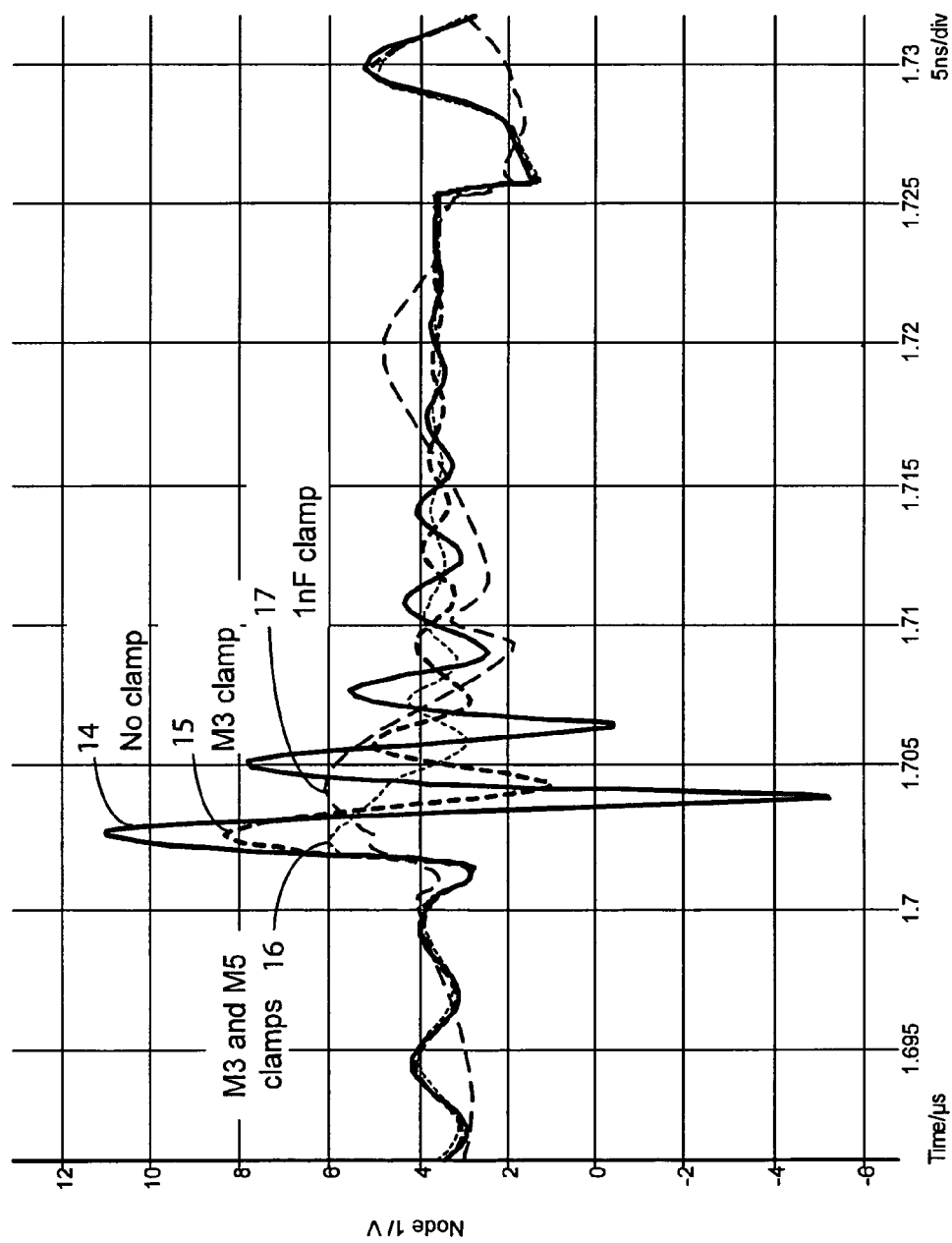
FIG. 6 shows the simulated result of a transient, occurring at the high side power device turn off transition, for the circuit described in FIG. 4 in various conditions.

FIG. 6 shows the simulated result of a transient occurring at the high side power device turn off transition, for the circuit described in FIG. 4, in various conditions. In particular the overvoltage occurring at the node 1 of FIG. 1 is reported in four different cases. The case of waveform 14 refers to the case when no clamp is present. It can be seen that the overvoltage can be very pronounced, reaching a voltage in excess of 11V. It should be mentioned that in all the shown cases the load was 1 A, the switching frequency 20 MHz, the parasitic inductance L2 at the node 1 of FIG. 4 was 3 nH.

The waveform 15 refers to the case where only the clamp M3 of FIG. 4 is present. It can be noticed that in this case the overvoltage peak is reduced to about 8V. The waveform 16 refers to the case where both clamps effects given by the transistors M3 and M5 of FIG. 4 are present. In this case it can be seen that the overvoltage glitch amplitude is reduced further to about 6V. Furthermore also the successive ringing of the voltage is very much damped with respect to all the other cases.

Finally the waveform 17 refers to the case where no active clamp is added but only a 1 nF filter capacitor is introduced, as shown in the prior art of FIG. 1. It can be highlighted that in this case the overvoltage spike amplitude is reduced approximately to the same value of the case of waveform 16, but the ringing is much more persistent. This graph demonstrates that adding active clamps can significantly attenuate the overvoltage and the successive voltage ringing of the node without using high value capacitors that occupy large silicon areas.

It should be mentioned that the shown waveforms may assume different forms and shapes depending on the driver circuits adopted and on the connections to the power rails. FIG. 6 should be intended as qualitative to demonstrate the significant improvement offered by the proposed invention.

E FIG. 7

Figure 7:
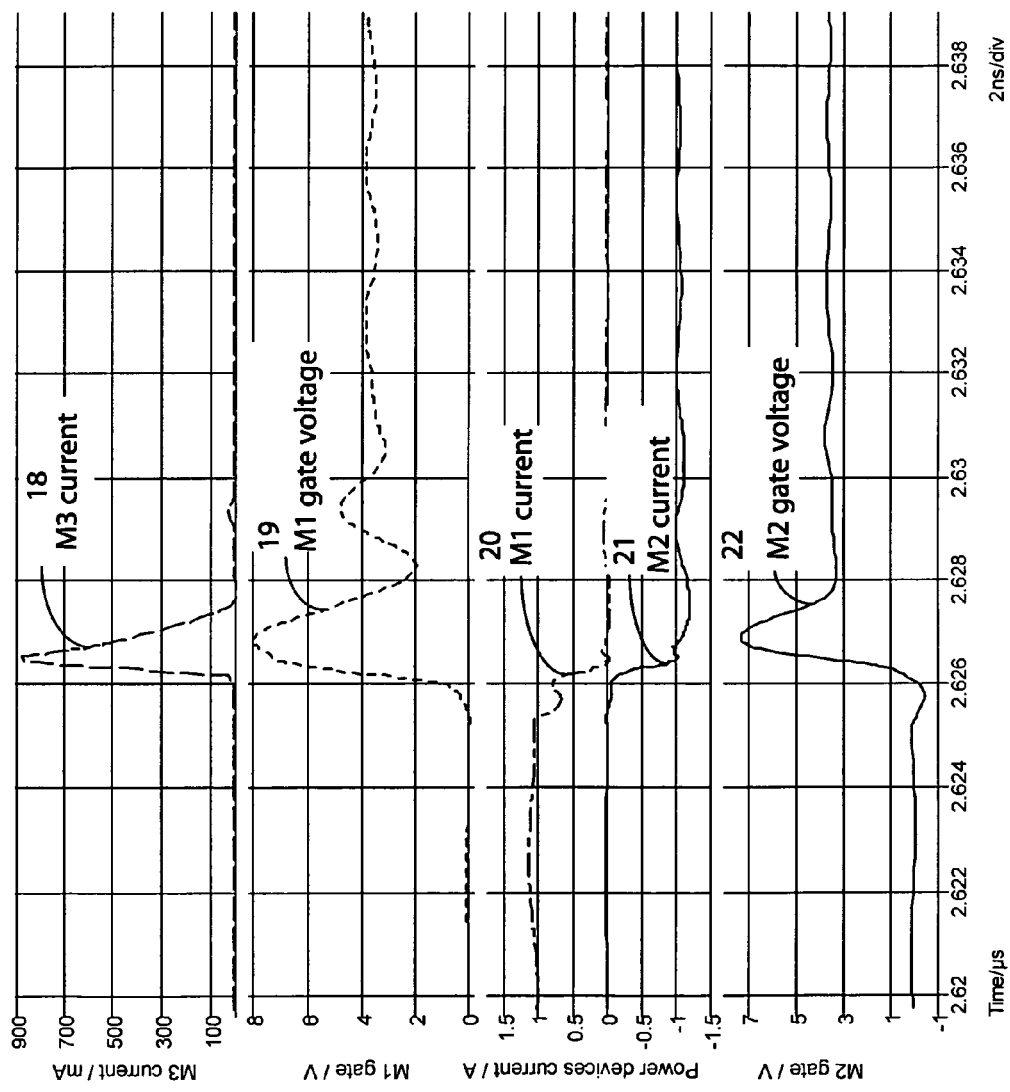
FIG. 7 shows the simulated result of a transient occurring at a switching transition of the power devices of a buck power converter whose output stage is shown in FIG. 3.

FIG. 7 shows the simulated result of a transient occurring at switching transition of the power devices of a buck power converter whose output stage is shown in FIG. 3. In this case the power converter output load is 1 A, the parasitic inductances L2, L3, L4 and L5 with reference to FIG. 3 are all 3 nH. The switching frequency is 20 MHz. The shown waveforms are focused on the turning off of the high side power device M1 and the successive turning on of the power device M2.

In particular the waveform 18 represents the current flowing in the clamp transistor M3 when the transistor M1 is turned off. It can be noted that the current spike in correspondence of the overvoltage spike at node 1, can be quite high (in the shown simulation waveform about 900 mA). That explains why the clamp transistors must have adequate size. The waveform 19 reports the gate of the high side power transistor M1 which is brought high to turn the device off.

The waveforms 20 and 21 represent the current flowing in the two power devices at the transition point. The shown currents are respectively the source current of M1 and the drain current of M2. These two currents are shown together to verify that no cross-conduction current is present at the switching transition, in fact no high simultaneous and positive current is showing in the power devices. The waveform 22 is the gate voltage of the low side power transistor M2. It can be noticed that the two gate voltages 19 and 22 are only a few hundred ps (pico-seconds) apart (more exactly 250 ps), but as mentioned no shoot through current is observed.

One important observation is that the current in M1 is already approaching zero current when the current in M3 start rising to charge the gate of M2 and even more importantly the gate voltage of M2 starts rising when the current in M1 is substantially null already. The situation gets even safer if a small filter capacitor is added to the spiking node because in that case the current in power device falls earlier with respect to the gate voltage of the low side power device rising. This is what leads to the conclusion that the present invention introduces a novel method to guarantee fast switching transitions without shoot-through current.

In the presented case the overvoltage peaks at the gates of M1 and M2 are clearly too pronounced to be acceptable, therefore requiring eventual further limiting, but the simulated result highlights the exceptionally low propagation delay with complete absence of cross-conduction current.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A circuit to attenuate the voltage spikes caused by a parasitic inductance of a high current interconnection to a power distribution rail, in correspondence of switching transitions of a first power device of a switching apparatus, wherein said first power device is coupled to said high current interconnection to said power distribution rail, comprising:
    at least one transistor directly coupled to said high current interconnection of said power distribution rail and to a low current interconnection to said power distribution rail,
        wherein at least one of said transistors turns on when said voltage spikes reach the threshold of said transistor;
        whereby at least a portion of the excess energy stored in said parasitic inductance is transferred by at least one of said transistors to at least one node of said switching apparatus in correspondence of the occurrence of said voltage spikes;
        whereby no portion of said excess energy stored in said parasitic inductance is dissipated in said first power device, and
        whereby at least one of said transistors limits the instantaneous voltage across said first power device.

2. The circuit of claim 1 wherein at least one of said nodes of said switching apparatus is the gate of a second power device, and
    wherein said second power device is turned on as result of said transferring of at least a portion of said excess energy stored in said parasitic inductance of said high current interconnection to said power distribution rail.

3. The circuit of claim 1 wherein said switching apparatus is a switching power converter.

4. The circuit of claim 1 wherein at least one of said nodes of said switching apparatus is the output terminal of a switching power converter.

5. The circuit of claim 1 wherein at least one of said nodes of said switching apparatus is a node of the driver circuit of said switching apparatus,
    wherein said driver circuit of said switching apparatus provides the signals to drive a second power device and,
    whereby the voltage of said node is altered by the turning on of at least one of said transistors to indicate that said first power device is turning off.

6. The circuit of claim 1 wherein at least one of said transistors is a MOS transistor.

7. The circuit of claim 1 wherein at least one of said transistors is a bipolar transistor.

8. A method for reducing the voltage spikes caused by a parasitic inductance of high current interconnection to a power distribution rail in correspondence of the switching transitions of a first power device of a switching apparatus, wherein said first power device is coupled to said high current interconnection to said power distribution rail, comprising:
    turning on at least one transistor directly coupled to said high current interconnection to said power distribution rail and to a low current interconnection to said power distribution rail;
        whereby at least one of said transistors turns on in correspondence to said voltage spikes;
        whereby no portion of the excess energy stored in said parasitic inductance is dissipated in said first power device;
    transferring at least a portion of said excess energy stored in said parasitic inductance to at least one node of said switching apparatus, and
    limiting the amplitude of said voltage spikes by means of conducting current in at least one of said transistors.

9. The method of claim 8 wherein at least one of said transistors transfers at least a portion of said excess energy stored in said parasitic inductance to a gate of a second power device to turn on said second power device in correspondence of the turning off of said first power device,
    whereby said transferring of at least a portion of said excess energy guarantees no substantial simultaneous conduction of said first and second power devices.

10. The method of claim 8 wherein said switching apparatus is a switching power converter.

11. The method of claim 8 wherein at least one of said transistors is a MOS transistor.

12. The method of claim 8 wherein at least one of said transistors is a bipolar transistor.

13. The method of claim 8 wherein at least one of said nodes of said switching apparatus is the output terminal of a switching power converter.

14. A method of preventing cross conduction between a first and a second series-coupled power device of a switching apparatus comprising:
- turning off said first power device coupled to a high current interconnection to a power distribution rail;
- monitoring the voltage spike caused by the parasitic inductance of said high current interconnection to said power distribution rail, and occurring in correspondence of the switching transition of said first power device;
- utilizing said voltage spike as a signal to the driving section of said switching apparatus indicating that said first power device is turning off;
- transferring at least a portion of the excess energy stored in said parasitic inductance to at least one node of said switching apparatus;
- turning on said second power device in response to said transferring of at least a portion of said excess energy;
  - whereby said transferring of at least a portion of said excess energy guarantees no substantial simultaneous conduction of said first and second power devices and very minimum delay between said turning off of said first power device and said turning on of said second power device, and
  - whereby said transferring of at least a portion of said excess energy is limiting the amplitude of said voltage spike.

15. The method of claim 14 wherein said switching apparatus is a switching power converter.

16. The method of claim 14 wherein at least one node of said switching apparatus is the output terminal of a switching power converter.

* * * * *